United States Patent

Rajeevakumar

Patent Number: 5,283,453
Date of Patent: Feb. 1, 1994

[54] TRENCH SIDEWALL STRUCTURE

[75] Inventor: Thekkemadathil Rajeevakumar, Scarsdale, N.Y.

[73] Assignee: International Business Machines Corporation, Armonk, N.Y.

[21] Appl. No.: 956,125

[22] Filed: Oct. 2, 1992

[51] Int. Cl.$^5$ .............................................. H01L 29/68
[52] U.S. Cl. .................................. 257/304; 257/297; 257/301; 257/924; 257/751
[58] Field of Search .............. 257/297, 301, 304, 915, 257/751, 756, 520, 302, 305

[56]     References Cited

U.S. PATENT DOCUMENTS

| | | | |
|---|---|---|---|
| 4,605,947 | 8/1986 | Price et al. | 257/751 |
| 4,621,414 | 11/1986 | Iranmanesh | 29/576 |
| 4,689,871 | 9/1987 | Malhi | 437/40 |
| 4,783,248 | 11/1988 | Kohlhase et al. | 204/192.17 |
| 4,914,739 | 4/1990 | Malhi | 257/302 |
| 4,914,740 | 4/1990 | Kenney | 257/304 |
| 4,920,389 | 4/1990 | Itoh | 257/302 |
| 5,021,849 | 6/1991 | Pfiester et al. | 257/365 |
| 5,164,333 | 11/1992 | Schwalke et al. | 437/200 |

FOREIGN PATENT DOCUMENTS

| | | |
|---|---|---|
| 60-72261 | 4/1985 | Japan . |
| 1-120050 | 5/1989 | Japan . |
| 1-222469 | 9/1989 | Japan . |

OTHER PUBLICATIONS

"Metal-Oxide-Semiconductor Field Effect Transistor with Polysilicon Gate Doped with Same Impurity as Substrate", IBM Technical Disclosure Bulletin, vol. 28, No. 7, Dec. 1985, pp. 3149–3150.

*Primary Examiner*—Jerome Jackson
*Assistant Examiner*—Courtney A. Bowers
*Attorney, Agent, or Firm*—Heslin & Rothenberg

[57]     ABSTRACT

The invention provides a trench sidewall structure and a method of forming and using the same to reduce parasitic sidewall leakage through a trench sidewall, for example from bitline contact to storage node or from storage node to substrate. The method involves placing a polysilicon layer of the same polarity as that of the array well, along with a diffusion barrier layer such an titanium nitride, between the storage node poly and the oxide collar.

11 Claims, 3 Drawing Sheets

FIG. 1
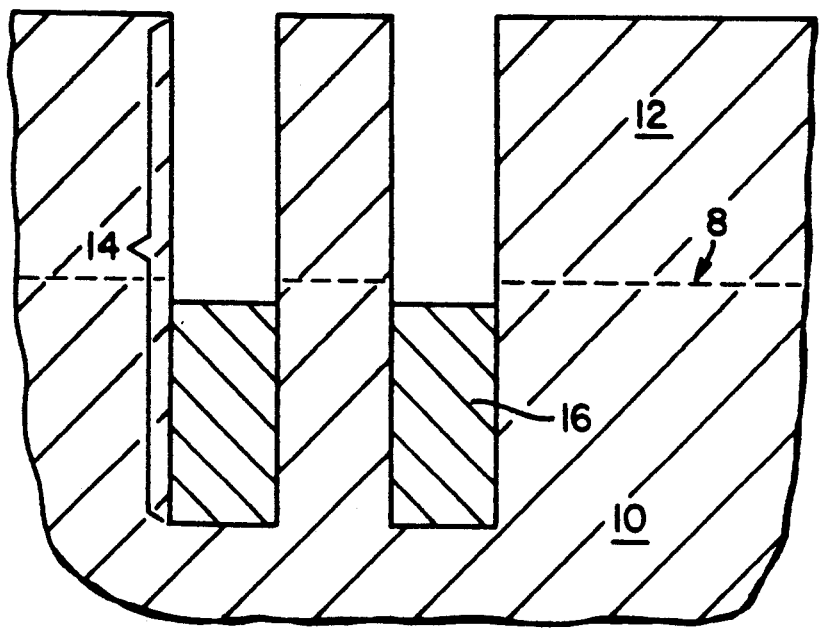
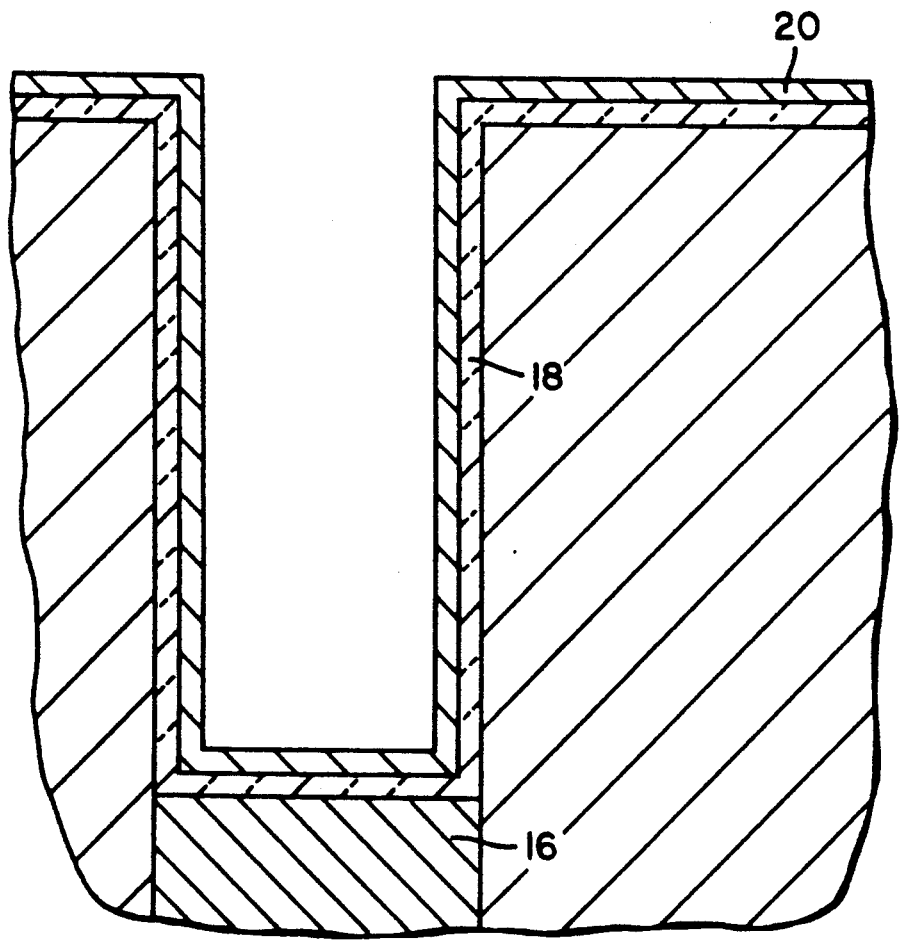
FIG. 2

TRENCH SIDEWALL STRUCTURE

TECHNICAL FIELD

This invention relates to a trench sidewall structure. More specifically, the invention relates to a sidewall structure which comprises an oxide collar layer, a doped polysilicon layer, and a diffusion barrier layer. The trench sidewall structure reduces trench sidewall leakage between the storage node poly and the oxide collar.

BACKGROUND ART

For trench DRAM cells, one serious drawback is the parasitic sidewall leakage through the trench sidewalls. This is due to the formation of a parasitic sidewall transistor as explained in a paper by N. C. C. Lu et al., IEEE J. Solid-State Circuits SC-21: 627 (1986). The parasitic MOS transistor causes a leakage current to pass through a sidewall portion of a channel formed adjacent to the trench. Such leakage can occur from bitline contact to the storage node, and from storage node to the substrate, for example. One way to reduce this parasitic sidewall leakage is to increase the thickness of the oxide collar normally placed around the trench near the top of the trench (the trench neck). However, collar thickness is increased at the expense of storage node thickness within the trench, the size of the trench opening being fixed. Thus, increasing the collar thickness (1) reduces the contact area available for contact with the storage node, (2) increases the RC time constant of the storage node poly, and (3) introduces other process constraints.

Minimizing the leakage of stored charge to preserve the stored information is important to the functional operation of dynamic memory (DRAM). For most trench DRAM cells, this means reducing the parasitic sidewall leakage to the lowest levels, without affecting other cell characteristics. Increasing the collar thickness alone is not a viable alternative, especially with increasing memory cell density when memory cells are scaled down. It is therefore desirable to find alternative ways to reduce trench sidewall leakage which do not have these drawbacks associated with increased collar thickness.

DISCLOSURE OF INVENTION

In furtherance of this objective, the present invention is directed to a trench sidewall structure which reduces leakage through the trench sidewall. The trench sidewall structure disclosed herein is a viable alternative to reduce the parasitic sidewall leakage for the present and future DRAMs.

The invention provides a heavily doped polysilicon layer and a diffusion barrier layer placed between the storage node poly of a trench and the oxide collar of the trench. The heavily doped polysilicon layer has the same polarity as the array well into which the trench is placed. In general, the DRAM cell is placed in a well near the surface of the substrate. The polarity of the array well doping is opposite to that of the substrate. For example, consider an n+ substrate with a p-well. If the trench array is placed in a p-well, a p+ polysilicon layer is placed between the storage node poly (generally n+ polysilicon with an n+ substrate) and the oxide collar (for example, tetraethylorthosilicate [TEOS]or other deposited oxide). A diffusion barrier layer is also added, which makes ohmic contact with the p+ polysilicon layer as well as the n+ polysilicon in the storage node, to prevent the formation of a p-n junction. Preferably, the diffusion barrier layer comprises titanium nitride. Another equally good diffusion barrier is tantalum nitride, or other materials having similar diffusion barrier properties.

The effect of this trench sidewall structure is to shift the threshold voltage by 1.1 V and thereby reduce the subthreshold leakage through the trench sidewall. This is in addition to the effect of the oxide collar in reducing leakage. Thus, using the subject invention, leakage current may be reduced without increasing the thickness of the oxide collar. Alternatively, the oxide collar thickness may be reduced while keeping the same leakage, if the trench sidewall structure of the subject invention is utilized.

The trench structure is formed by initially etching a trench. This is done by anisotropically etching the silicon substrate to the required trench depth using an oxide or silicon nitride mask. A capacitor insulator is formed, and the trench is filled with polysilicon, planarized, and recessed to a depth more than the well. In one example, an n+ substrate, a p-well, and an n+ poly fill is utilized. A thin layer of TEOS for the oxide collar is then deposited followed by a thin p+ polysilicon layer. The polysilicon and the TEOS are then anisotropically etched to form spacers. A thin layer of titanium nitride is then deposited followed by n+ polysilicon deposition. The n+ polysilicon is then planarized and recessed, and the exposed titanium nitride is etched off. Further conventional processing is then used to form the desired cell structure which incorporates the trench having the sidewalls as provided herein.

BRIEF DESCRIPTION OF DRAWINGS

The foregoing and other objects, features and advantages of the invention will be apparent from the following more particular description of preferred embodiments of the invention as illustrated in the accompanying drawings in which:

FIG. 1 is a cross-section side elevational view of a trench;

FIG. 2 is a cross-section side elevational view of the trench shown in FIG. 1 after deposition of an oxide collar and a doped polysilicon layer;

BEST MODE FOR CARRYING OUT THE INVENTION

Figure 6:
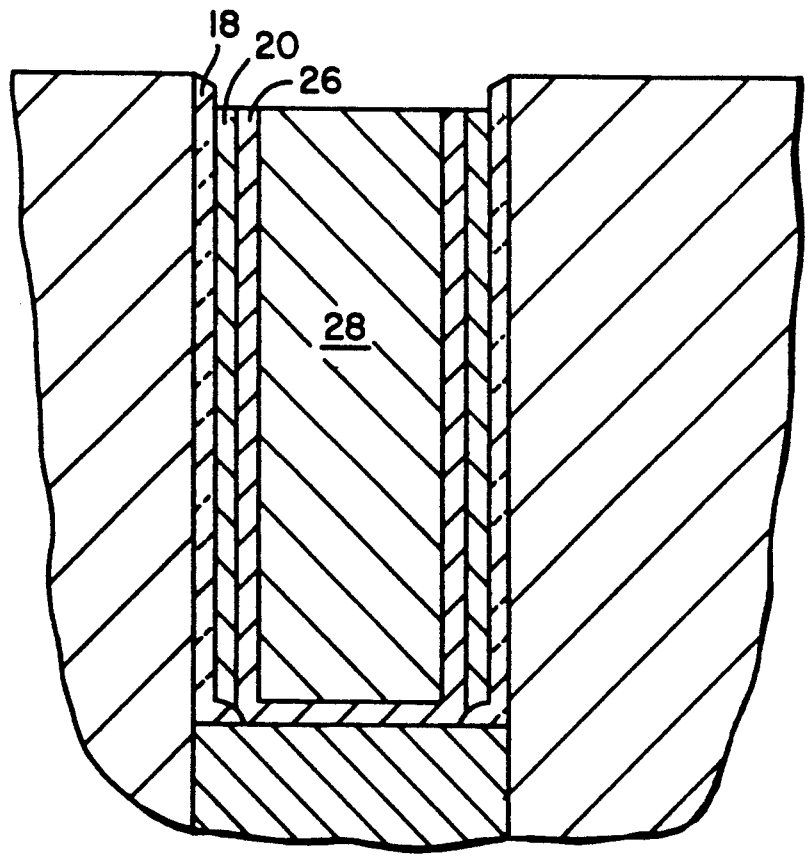
FIG. 6 is a cross-section side elevational view of the trench structure shown in FIG. 5 after the n+ polysilicon is planarized and recessed, and the exposed diffusion barrier layer is etched off.

As mentioned previously, the broad concept of the subject invention is directed to a trench sidewall structure which helps reduce trench sidewall leakage. The trench sidewall structure, as is best shown in FIG. 6, comprises an oxide collar layer 18, adjacent a doped polysilicon layer 20, adjacent a diffusion barrier layer 26. The doped polysilicon layer 20 and the diffusion barrier layer 26 separate the oxide collar layer 18 from the trench storage node polysilicon 28. This sidewall structure helps to reduce leakage through the well adjacent to the trench sidewall, for example from the storage node polysilicon 28 to substrate 10.

Figure 3:
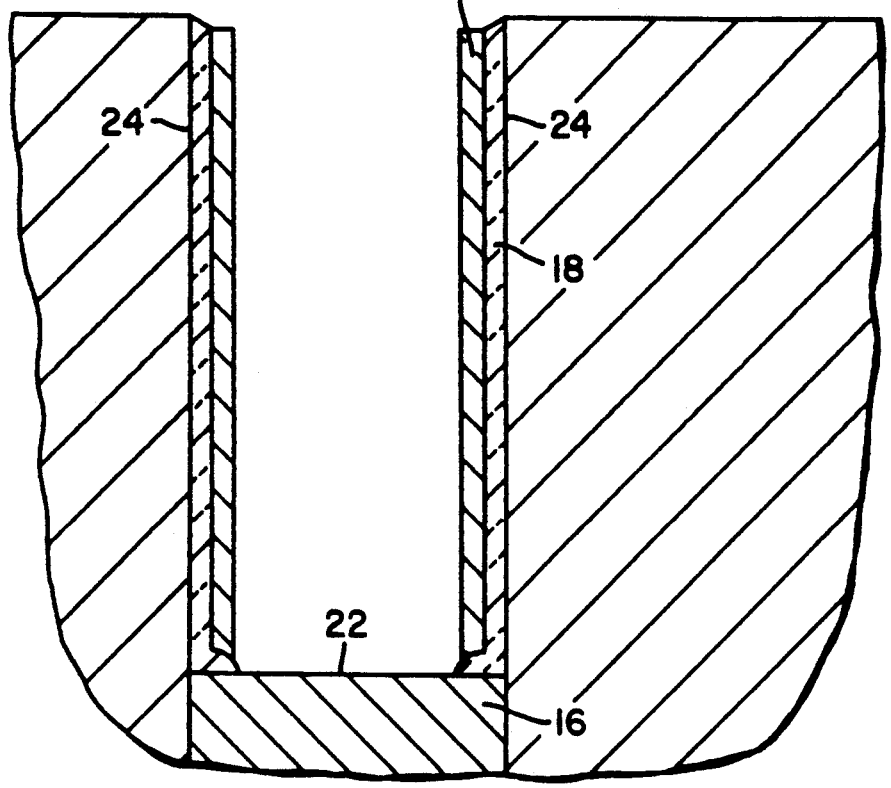
FIG. 3 is a cross-section side elevational view of the trench structure shown in FIG. 2 after anisotropic etching of the oxide collar and the doped polysilicon layer to form spacers.

The invention may be more readily understood by describing the process by which the trench sidewall structure is formed. Referring to FIG. 1, an n+ semiconductor substrate 10 having a p-well 12 formed therein is shown. A trench 14 has been formed in the substrate 10 and partially in the p-well 12. The polysilicon fill 16 is recessed to a level below the well 12. 8 shows the end of the well. As shown in FIG. 2, an oxide collar layer 18 is conformally deposited into the trench, over which a further layer of doped polysilicon 20 is conformally deposited adjacent to the oxide collar layer 18. The oxide collar layer 18 and doped polysilicon layer 20 are then anisotropically etched to remove these layers from the bottom surface 22 of the trench adjacent the polysilicon 16 fill (see FIG. 3). By utilizing anisotropic etching, the oxide collar layer 18 and the doped polysilicon layer 20 remain on the vertical sidewalls 24 of the trench.

Figure 4:
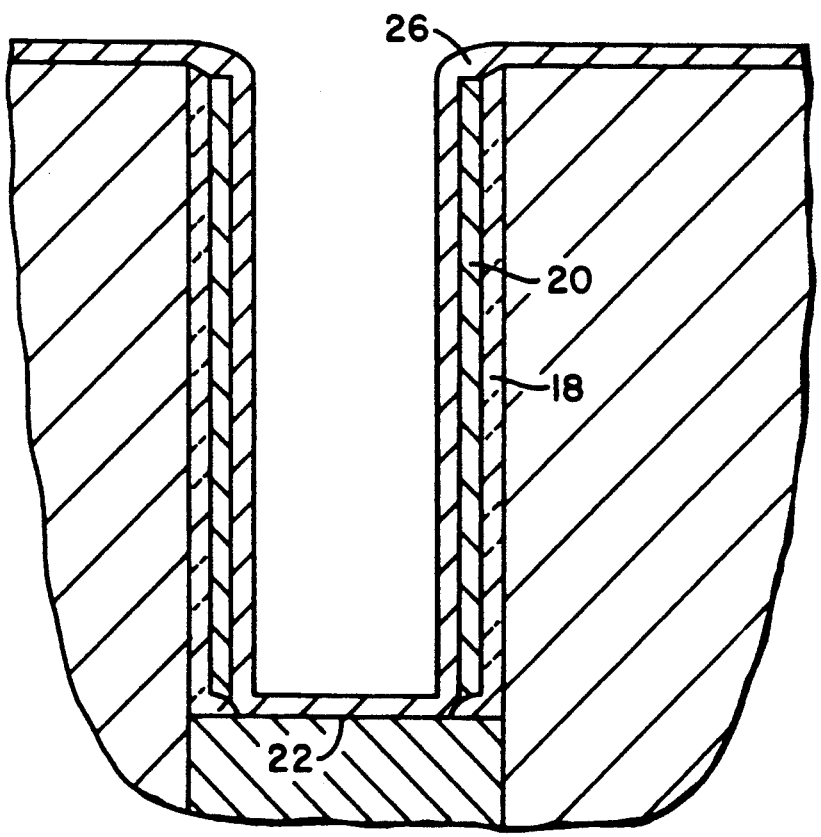
FIG. 4 is a cross-section side elevational view of the trench structure shown in FIG. 3 after deposition of a diffusion barrier layer.
Figure 5:
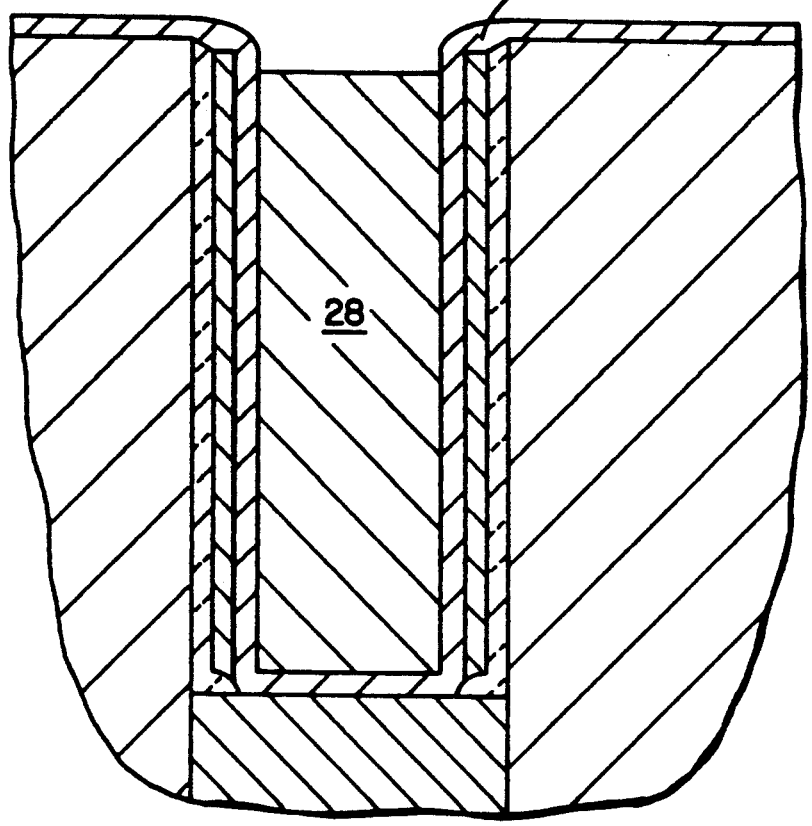
FIG. 5 is a cross-section side elevational view of the trench structure shown in FIG. 4 after the trench is filled with n+ polysilicon to form the storage node of the trench.

As shown in FIG. 4, a diffusion barrier layer 26 is then conformally deposited, such that it is adjacent to the bottom surface 22 and the doped polysilicon 20. The trench is then filled, for example with n+ polysilicon, to form the storage node 28 as shown in FIG. 5. The storage node 28 is planarized and recessed, after which the exposed diffusion barrier layer 26 is etched off (see FIG. 6). This leaves a trench structure comprising the storage node 28 surrounded by the trench sidewall structure of oxide collar 18, doped polysilicon 20, and diffusion barrier layer 26. Further processing according to known techniques can then be utilized to form various cell structures utilizing the trench structure. Such a structure is useful whenever trench sidewall leakage is a problem and the reduction of such leakage can be provided by the subject invention.

Various materials and methods can be utilized to form and to comprise the trench sidewall structure. In the preferred embodiment, the trench sidewall structure is utilized in a p-well array on an n+ substrate, with a trench having an n+ polysilicon storage node. A TEOS oxide collar is provided, adjacent a p+ doped polysilicon layer, adjacent a titanium nitride diffusion barrier layer. This structure effectively reduces trench sidewall leakage, for example from the trench storage node to the substrate through the well adjacent to the oxide collar. Other combinations are also possible. For example, an n-well array over a p+ substrate with p+ storage node polysilicon inside can be utilized. For this structure, an n+ polysilicon layer is placed between the oxide collar and the titanium nitride diffusion barrier. In addition, other suitable materials for the oxide collar, such as silicon nitride or other forms of oxide, may be used. Other suitable materials for the diffusion barrier layer are tantalum nitride, for example. The p+ doped polysilicon layer has the same polarity as the array well. Therefore, if the trench is placed in an n+ well, an n+ doped polysilicon layer would be placed between the storage node poly and the oxide collar.

Various etching and deposition techniques known in the art can be utilized to form the various layers of the trench sidewall structure. For example, deposition of the oxide collar and the doped polysilicon layers, as well as the diffusion barrier layer, should be by a method which results in a conformally deposited layer, such as chemical vapor deposition. Sputtering techniques or plasma deposition could also be utilized as long as conformal deposition is attainable. The anisotropic etch can utilize suitable etchants, which depend upon the material being etched. In the case of the preferred embodiment, an anisotropic etch of p+ doped polysilicon may be performed by reactive ion etching using bromine or chlorine based chemistry. The anisotropic etch of the oxide layer is done by reactive ion etching using fluorine based chemistry. Reactive ion etching using chlorine based chemistry may be used to etch titanium nitride. The etching of tantalum nitride is similar to that of titanium nitride.

The resulting sidewall structure of the preferred embodiment is placed inside a trench of opening dimensions about 0.5 microns, and has a diffusion barrier layer of a thickness of about 10 nm, a doped polysilicon layer of a thickness of about 100 nm, and an oxide collar layer of a thickness of about 25 nm. These layer thicknesses can be altered depending upon the reduction in leakage desired. In the preferred embodiment, the subthreshold leakage is reduced by a voltage bias of 1.1 V (bandgap). It is also possible to reduce the oxide collar thickness, if desirable, while still maintaining the same sidewall leakage as the thicker oxide collar provided, if the sidewall structure of the invention is utilized.

While the invention has been particularly shown and described with reference to preferred embodiments thereof, it will be understood by those skilled in the art that various changes in form and details may be made therein without departing from the spirit and scope of the invention.

We claim:

1. A trench structure comprising:
   a) a storage node of polysilicon; and
   b) a trench sidewall surrounding said storage node, said trench sidewall having a structure which comprises:
      i. a diffusion barrier layer adjacent said storage node;
      ii. a doped polysilicon layer adjacent said diffusion barrier layer; and
      iii. an oxide collar layer adjacent said doped polysilicon layer.

2. The trench structure of claim 1 wherein said oxide collar layer comprises a material selected from the group consisting of tetraethylorthosilicate and a silicon oxide.

3. The trench structure of claim 1 wherein said diffusion barrier layer comprises a material selected from the group consisting of titanium nitride and tantalum nitride.

4. The trench structure of claim 1 wherein said doped polysilicon layer comprises p+ polysilicon.

5. The trench structure of claim 1 wherein said doped polysilicon layer comprises n+ polysilicon.

6. The trench structure of claim 1 wherein said trench sidewall and said storage node are formed in a silicon region of a substrate, said doped polysilicon layer having a conductivity type identical to a conductivity type of said silicon region.

7. The trench structure of claim 6 wherein said conductivity type comprises p+.

8. The trench structure of claim 6 wherein said conductivity type comprises n+.

9. The trench structure of claim 1 wherein the trench structure comprises a portion of a trench DRAM cell structure.

10. The trench structure of claim 1 wherein said storage node of polysilicon comprises n+ polysilicon.

11. The trench structure of claim 1 wherein said storage node of polysilicon comprises p+ polysilicon.

* * * * *